US012706609B2

(12) United States Patent
Périn et al.

(10) Patent No.: US 12,706,609 B2
(45) Date of Patent: Aug. 11, 2026

(54) FLEXIBLE PHASE-LOCK LOOP GEAR SHIFTING

(71) Applicant: NXP B.V., Eindhoven (NL)

(72) Inventors: Mathieu Périn, Cairon (FR); Stefano Dal Toso, Antibes (FR); Khurram Waheed, Austin, TX (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/798,617

(22) Filed: Aug. 8, 2024

(65) Prior Publication Data

US 2025/0055466 A1 Feb. 13, 2025

(30) Foreign Application Priority Data

Aug. 11, 2023 (EP) .................................... 23306365

(51) Int. Cl.

*H03L 7/099* (2006.01)
*H03L 7/081* (2006.01)
*H03L 7/085* (2006.01)

(52) U.S. Cl.

CPC .......... *H03L 7/0991* (2013.01); *H03L 7/0814* (2013.01); *H03L 7/085* (2013.01)

(58) Field of Classification Search

CPC ..... H03L 7/0991; H03L 7/0814; H03L 7/085; H03L 7/09

See application file for complete search history.

(56) References Cited

U.S. PATENT DOCUMENTS 6,851,493 B2 2/2005 Staszewski et al.
7,145,399 B2 12/2006 Staszewski et al.
7,327,174 B2 2/2008 Fan et al.
7,961,038 B2 6/2011 Park et al.
7,978,014 B2 7/2011 Chen et al.
8,126,401 B2 2/2012 Staszewski et al.
8,830,001 B2 9/2014 Zhuang et al.
10,439,622 B2 10/2019 Tsuda
2003/0234693 A1* 12/2003 Staszewski ........... H03L 7/0991 331/16
2007/0024383 A1 2/2007 Spijker et al.
2009/0325494 A1* 12/2009 Staszewski ............. H03L 7/093 455/43
2010/0145482 A1* 6/2010 Park ......................... G05B 1/03 700/41

(Continued)

FOREIGN PATENT DOCUMENTS

CN 116131846 A 5/2023

OTHER PUBLICATIONS

U.S. Appl. No. 18/799,117, filed Aug. 9, 2024, 31 pages.

(Continued)

*Primary Examiner* — Jean B Corrielus

(57) ABSTRACT

Provided is a phase-lock loop gear shifter that includes: an input for receiving a loop gain that is dynamically controllable; an input for receiving a phase-error signal; a subtractor configured to provide a gain difference between the loop gain input at a second time and the loop gain input at a first time, the first time being earlier than the second time; a module that determines a characteristic phase-error value based on the phase-error signal; and a multiplier that multiplies the gain difference by the characteristic phase-error value to provide a control-signal correction value.

20 Claims, 7 Drawing Sheets

(56) References Cited

U.S. PATENT DOCUMENTS

| | | | |
|---|---|---|---|
| 2011/0148489 | A1 | 6/2011 | August et al. |
| 2018/0373608 | A1 | 12/2018 | Cho et al. |

OTHER PUBLICATIONS

Barrett, Curtis; “Fractional/Integer-N PLL Basics”; Texas Instruments Technical Brief SWRA029, Wireless Communication Business Unit; Aug. 1999; 55 pgs.

Johansson, Ted; “TSEK03: Radio Frequency Integrated Circuits (RFIC)”; Linköping University; Lecture 10: PLL; 2019; 62 pgs.

U.S. Appl. No. 18/799,117 Non-Final Office Action mailed Mar. 11, 2026; 22 pages.

U.S. Appl. No. 18/799,117 Final Office Action mailed Jun. 5, 2026; 20 pages.

* cited by examiner

40
α 43
NOTWP
44
45
42
PHE/PHEFILT
59
14
NOTW
58
47
ρ
IEN
56
50
NOTWI
55
Σ
48
52
37 CKR

FLEXIBLE PHASE-LOCK LOOP GEAR SHIFTING

CROSS-REFERENCE TO RELATED APPLICATIONS

This application claims the priority under 35 U.S.C. § 119 of European Patent application no. 23306365.0, filed on 11 Aug. 2023, the contents of which are incorporated by reference herein.

FIELD OF THE INVENTION

The present invention pertains, among other things, to systems, apparatuses, methods and techniques for improved gear shifting in a phase-lock loop (PLL).

BACKGROUND

The following discussion concerns certain background information related to the present invention. However, it should be understood that only knowledge clearly, explicitly and specifically described herein as being "conventional" or "prior art" is intended to be characterized as such. Everything else should be understood as knowledge and/or insight originating from the present inventors.

PLLs commonly are used in situations in which a periodic signal source that is highly controlled in frequency and phase is desired. The basic structure of an exemplary conventional digital PLL (DPLL) 10 is illustrated in FIG. 1. As shown, DPLL 10 includes a frequency-controllable oscillator, here a Digitally Controlled Oscillator (DCO) 12 which produces a periodic output signal such as a sinusoid, a square wave, a digital CMOS clock (analog) output signal 13 based on a digital control signal 14, usually referred to herein as a normalized oscillator tuning word (NOTW), which is then scaled to provide an oscillator tuning word (OTW) that is directly used by the DCO 12 (not shown in the drawings for sake of simplicity). That digital control signal 14, in turn, is generated based on a digital reference signal 15 (typically, a digital clock signal), together with a modulation frequency control word (FCW) 16 and a channel FCW 17 that, together, specify how the output signal 13 is intended to be related to the digital reference signal 15.

For precise control of the output signal 13, a feedback path 20 is provided, in which phase information 21 regarding the output signal 13, generated by module 22, is provided to a digital phase detector 24 which, in turn, compares such phase information 21 to the reference signal 15 in order to identify and output a signal 25 indicating any phase error. Phase error signal 25 is then processed in digital filter 35 and used to provide the digital control signal 14 to DCO 12 in a manner calculated to reduce the phase error signal 25. Module 22 can have any of a variety of different implementations, e.g., so as to provide a counter-based DPLL or a divider-based DPLL, with or without phase prediction.

Upon startup of the DPLL 10, the phase error signal 25 often is quite large. Conventionally, it can take a significant amount of time for the phase error to reach an acceptably small level, at which point the DPLL 10 is considered locked, and the feedback loop 20 then keeps the phase error at that small level, at least until there is some disruption that requires a re-locking.

Loop filter 35 typically includes a controller (e.g., proportional only or proportional integral) and also may include one or more finite-impulse-response (FIR) or infinite-impulse-response (IIR) filters. An example of such a controller 40 is shown in FIG. 2. Processing within controller 40 (and loop filter 35 more generally) occurs on the discrete cycles of input clock signal 37. Input to the controller 40 is a phase error signal (PHE) 42, which may be direct from the phase detector 24 or, as noted in the preceding disclosure, might have been filtered first within an earlier stage of loop filter 35. Generally speaking, when used herein, the notation PHE 42 refers to any such filtered or unfiltered version of phase error signal 25, while the notation $PHE_{FILT}$ 42 means a filtered version of phase error signal 25.

As shown in FIG. 2, PHE 42 is multiplied by a proportional gain (a) 43 in multiplier 44 to provide the proportional component 45 (sometimes referred to herein as $NOTW_P$) of the control signal (or NOTW) 14. This entire signal path (through multiplier 44) is sometimes referred to herein as the proportional path. At the same time, PHE 42 is multiplied by an integral gain (ρ) 47 in multiplier 48 to provide an integral input signal 50 (sometimes referred to herein as $dNOTW_I$), which is then input into accumulator 52. The output of accumulator 52 is then the integral component 55 (sometimes referred to herein as $NOTW_I$) of the control signal (or NOTW) 14. As also shown, accumulator 52 also has an enable input 56, so that it can be turned on or off by a corresponding enable signal 58. When enabled, accumulator 52 outputs the accumulation of its inputs. When disabled, accumulator 52 outputs an integral component 55 of $NOTW_I=0$. Finally, adder 59 outputs control signal (or NOTW) 14 as the sum of $NOTW_P$ 45 and 55.

In many applications, a fast PLL locking time is highly desirable, e.g., to reduce power consumption and to enable fast turn-around times within radios. Reduction in locking time is particularly important for some applications, such as narrowband Bluetooth Low-Energy (LE) Channel Sounding. Several different techniques have been utilized in conventional PLLs to reduce locking time. For instance, as discussed in the Related Application, DPLL 10 can: (1) operate in any of several different modes, such as Type-I operation in which accumulator 52 is disabled (so that only proportional feedback is utilized), which typically results in faster convergence to a state of low phase error and/or Type-II or Pseudo-Type-II operation in which accumulator 52 is enabled (so that both proportional and integral feedback are utilized), which typically provides lower steady-state PHE variation; and (2) switch between such modes.

In addition, conventional PLLs have utilized gear shifting (i.e., adjusting the loop gain(s) 43 and/or 47) in order to divide the locking process into two separate portions: an initial phase-acquisition portion which uses a higher loop gain in order to provide a larger bandwidth, followed by a phase-tracking portion which typically uses a lower loop gain, resulting in smaller average phase errors during steady-state operation, at the cost of smaller bandwidth (a larger bandwidth no longer being necessary at that point).

A variety of different techniques exist to accommodate such gear shifting. However, the present inventors have discovered that further improvements in relation to gear shifting are desirable.

SUMMARY OF THE INVENTION

One embodiment of the invention is directed to a phase-lock loop gear shifter, comprising: an input for receiving a loop gain that is dynamically controllable; an input for receiving a phase-error signal; a subtractor configured to provide a gain difference between the loop gain input at a second time and the loop gain input at a first time, the first time being earlier than the second time; a module that determines a characteristic phase-error value based on the phase-error signal; and a multiplier that multiplies the gain difference by the characteristic phase-error value to provide a control-signal correction value.

Another embodiment is directed to a phase-lock loop, comprising: an oscillator having an input for receiving a control signal and an output for providing an output signal having a frequency based on the control signal; a phase detector having a first input for receiving a reference signal, a second input coupled to the output of the oscillator for receiving a feedback signal, and an output for providing a phase-error signal that is indicative of a phase difference between the reference signal and the feedback signal; and a loop filter having a first input coupled to the output of the phase detector and an output for providing the control signal to the oscillator. The loop filter has a gear-shifting module that includes: (a) an input for receiving a loop gain that is dynamically controllable, (b) a subtractor configured to provide a gain difference between the loop gain input at a second time and the loop gain input at a first time, the first time being earlier than the second time, (c) a module that determines a characteristic phase-error value based on the phase-error signal, and (d) a multiplier that multiplies the gain difference by the characteristic phase-error value to provide a control-signal correction value.

Certain more-specific implementations of either of the foregoing embodiment(s) include one or any combination of the following features.

A second multiplier multiplies the phase-error signal by the loop gain at the first time to provide a tentative control signal component.

The tentative control signal component is combined with the control-signal correction value to provide a component of the control signal.

The component of the control signal is a proportional component.

The component of the control signal is an integral input component.

Also included is an input for a clock signal, on each cycle of the clock signal, the phase-error signal and the loop gain are input and the control signal is output, the second time corresponds to the current clock cycle, and the first time corresponds to the clock cycle immediately preceding the current clock cycle.

Also included is an input for a gear-shift enable signal which controls when gear-shifting is enabled, and when gear-shifting is not enabled, the control-signal correction value is set at 0.

Also included is an input for a phase-compensation signal.

A second multiplier that multiplies the phase-compensation signal by the loop gain at the second time to provide a second control-signal correction value.

A third multiplier multiplies the phase-error signal by the loop gain at the first time to provide a tentative control signal component.

The control-signal correction value, the second control-signal correction value and the tentative control signal component are combined to provide a component of the control signal.

The characteristic phase-error value is based on at least one of a moving average or a time-windowed accumulation of the phase-error signal.

The characteristic phase-error value is determined by low-pass filtering the phase-error signal.

The characteristic phase-error value is based on a value of the phase-error signal at a single point in time.

The loop gain is a proportional-path gain.

The loop gain is an integral-path gain.

The loop filter also has a second gear-shifting module.

The second gear-shifting module outputs an integral input component of the control signal.

The loop filter also includes an accumulator.

The accumulator inputs the integral input component and outputs a final integral component.

The final integral component and the proportional component are combined to provide the control signal.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the accompanying drawings. However, it should be understood that the drawings merely depict certain representative and/or exemplary embodiments and features of the present invention and are not intended to limit the scope of the invention in any manner. The following is a brief description of each of the accompanying drawings.

DESCRIPTION OF THE PREFERRED EMBODIMENT(S)

For ease of reference, the present disclosure is divided into sections. The general subject matter of each section is indicated by that section's heading. However, such headings are included simply for the purpose of facilitating readability and are not intended to limit the scope of the invention in any manner whatsoever.

Overview

Switching gears without kicking loop phase error, thereby causing a disturbance and slowing down the locking time, is not straightforward. The preferred embodiments of the present invention can provide, among other things, efficient structures, processes and/or techniques to dynamically switch gears to either widen or narrow down a PLL's bandwidth without creating any significant glitch in the loop. In addition, unlike conventional structures and techniques that are only capable of a single shift from a phase-acquisition mode to a phase-tracking mode, the preferred embodiments of the present invention can provide for flexible gear shifting whenever desired and in any manner desired (e.g., from wider to narrower or narrower to wider, in any desired increment(s), combinations and/or sequences, and any number of times), with no limit on the number of different gears that can be used. Such preferred structures and techniques typically can simultaneously enable faster locking time and mitigation of PLL dynamics due to power amplifier (PA) pulling and/or non-constant envelope modulations.

Controller and Loop Filter.

Figure 3:
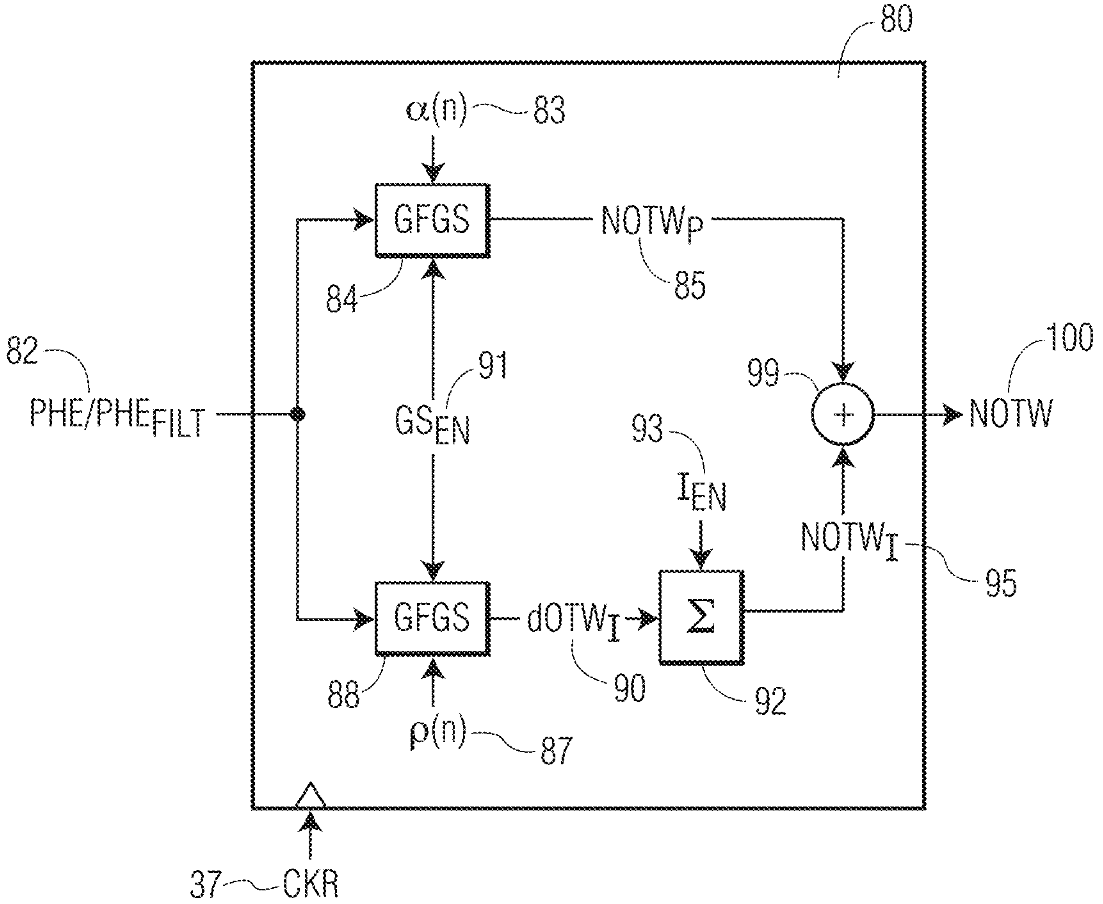
FIG. 3 is a block diagram of a PIC according to a representative embodiment of the present invention.

FIG. 3 is a block diagram of a controller 80 that can replace conventional controller 40 within DPLL 10. As shown, controller 80 inputs PHE 82 (which typically will have been output from phase detector 24, instead of PHE 25, with the difference between the two signals being primarily or entirely due to the use of controller 80 instead of controller 40). As shown, proportional and integral multipliers 44 and 48 (in controller 40) have been replaced with proportional and integral gear-shifting modules 84 and 88, respectively (which are discussed in greater detail below), providing proportional component $NOTW_P$ 85 (output by the proportional path) and accumulator input signal $dNOTW_I$ 90 (in the integral path), respectively.

As also discussed in greater detail below, an input gear-shift enable signal ($GS_{EN}$) 91 enables or disables the gear-shifting functionality, and when disabled, modules 84 and 88 preferably just function as conventional multipliers. Also, rather than a fixed proportional gain 43 and a fixed integral gain 47, proportional gain (α) 83 and integral gain (ρ) 87, respectively, which can vary over time (preferably arbitrarily, e.g., can be changed to any desired value on any desired clock cycle, when and as desired), instead are input. Accordingly, α and ρ according to the present invention sometimes are expressed as a function of the clock cycle n, i.e., as α(n) and ρ(n).

Figures 1, 2:
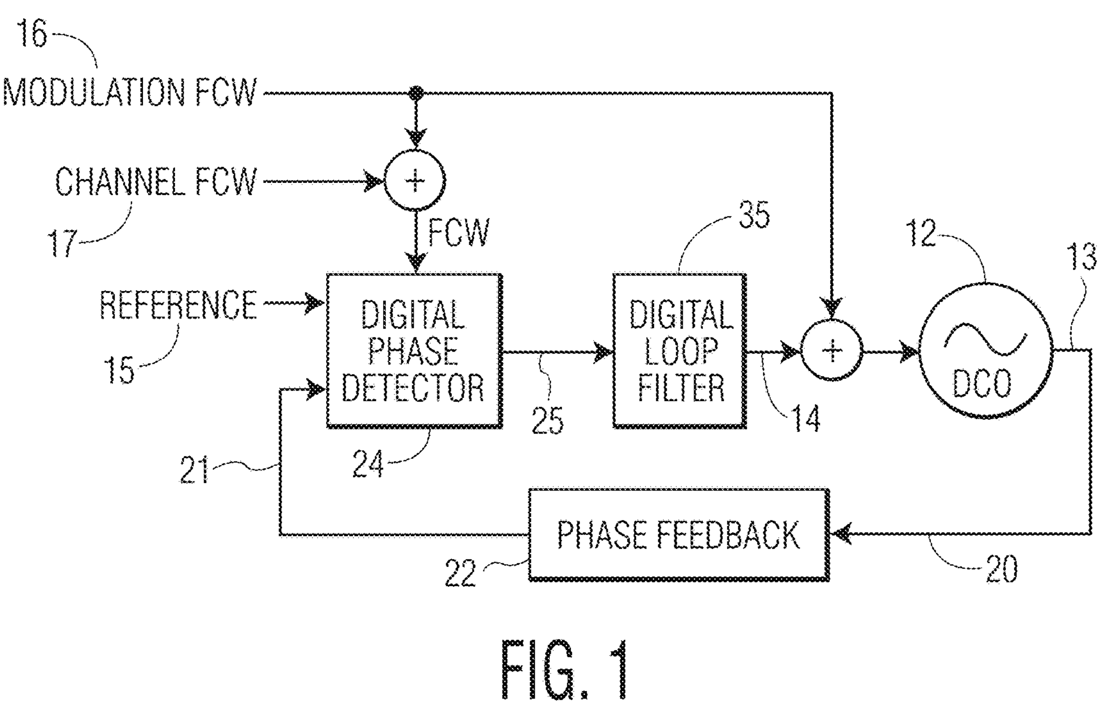
FIG. 1 is a block diagram of a conventional digital phase-lock loop (DPLL).
FIG. 2 is a block diagram of a conventional proportional integral controller (PIC).

Then, similar to controller 40, $dNOTW_I$ 90 is input into accumulator 92 (which is enabled or disabled by an accumulator-enable signal 93) to provide integral component $NOTW_I$ 95, and $NOTW_P$ 85 and $NOTW_I$ 95 are combined in adder 99 to provide control signal 100 (here, implemented as a NOTW), e.g., for provision to DCO 12 (shown in FIG. 1). Similar to what was noted above, when used herein, the notation PHE 82 refers to any filtered or unfiltered version of the raw phase error signal output from phase detector 24, while the notation $PHE_{FILT}$ 82 means a filtered version of that phase error signal.

Figure 4:
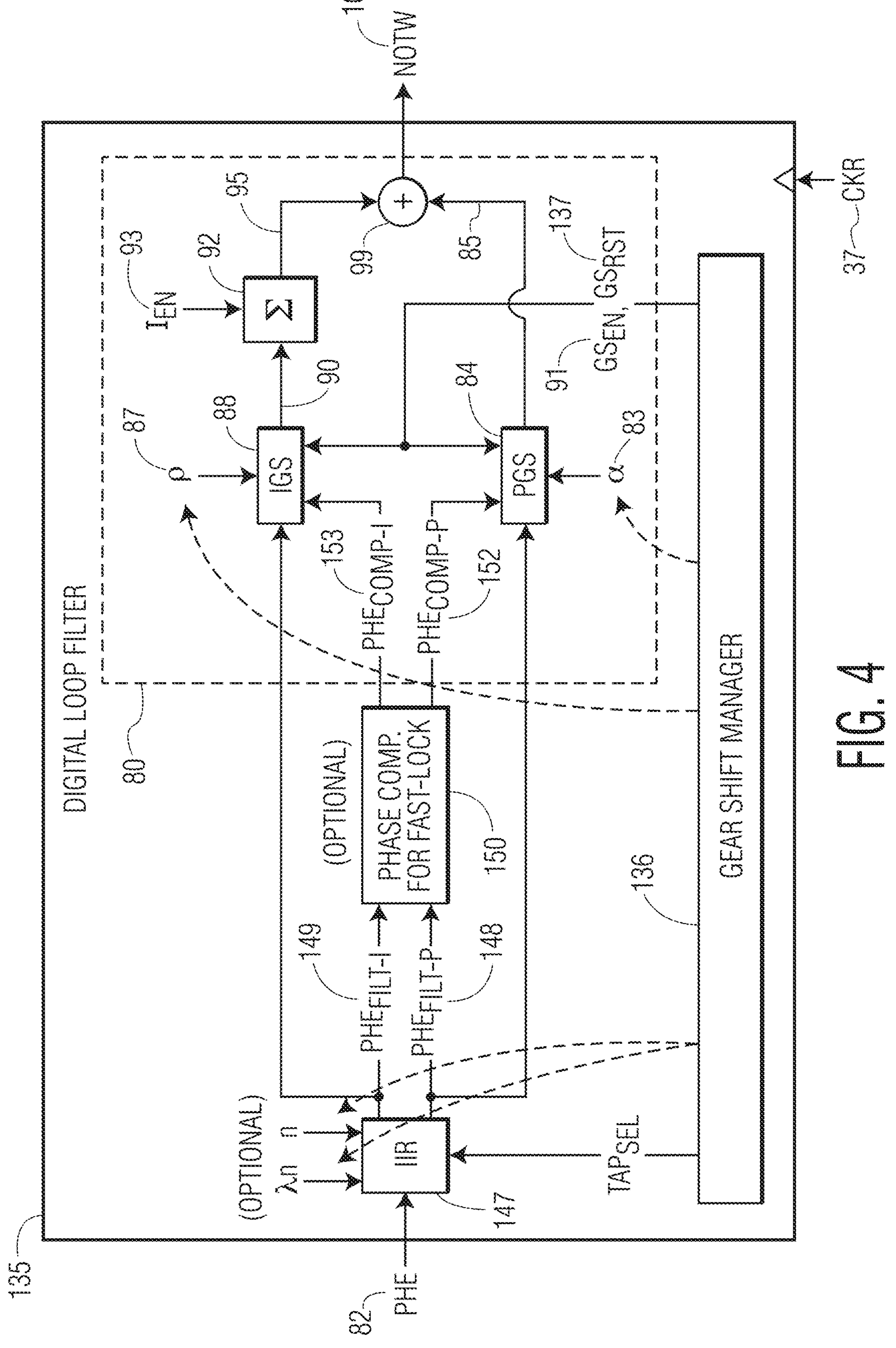
FIG. 4 is a block diagram of a digital loop filter according to a representative embodiment of the present invention.

For fuller context, FIG. 4 shows controller 80 within a digital loop filter 135, which can replace conventional digital loop filter 35 (discussed above). As shown, filter 135 includes a gear-shift manager 136 for setting the proportional gain (α) 83 and integral gain (ρ) 87 values (e.g., in order to achieve the desired bandwidth at any given point in time, based on any of a variety of different information) and for providing the gearshift enable signal ($GS_{EN}$) 91 and the gearshift reset signal ($GS_{RST}$) 137, as discussed in greater detail below. It should be noted that in alternate embodiments any or all of the functionality provided by gear-shift manager 136 may be provided by component(s) (e.g., one or more processors, finite state machines, or in any other manner described in the System Environment section below) outside of filter 135.

Input to filter 135 is PHE 82. As noted above, PHE 82 optionally is processed by filter(s) 147 (e.g., one or more IIR or FIR low-pass filters under the control of gear-shift manager 136, e.g., controlled with respect to the nature and/or amount of such filtering). To the extent that such filtering is provided, again depending upon the specific embodiment, the output of filter(s) 147 can be a filtered proportional phase-error signal ($PHE_{FILT-P}$) 148 and a filtered integral phase-error signal ($PHE_{FILT-I}$) 149, as shown, or a single filtered signal (i.e., $PHE_{FILT-P}$=$PHE_{FILT-I}$ which can be designated simply as $PHE_{FILT}$). In any event, PHE 82 (whether filtered or not) is: (1) provided to proportional gear-shifting module 84 and to integral gear-shifting module 88; and (2) optionally processed by phase-compensation module 150 (e.g., as discussed in the Related Application) to generate a compensated proportional phase-error signal ($PHE_{COMP-P}$) 152 and a compensated integral phase-error signal ($PHE_{COMP-I}$) 153, which, if generated, are provided as additional signals to proportional gear-shifting module 84 and to integral gear-shifting module 88, respectively. Various implementations of proportional gear-shifting module 84 and integral gear-shifting module 88 are now discussed.

Gear-Shifting Modules.

Figure 5:
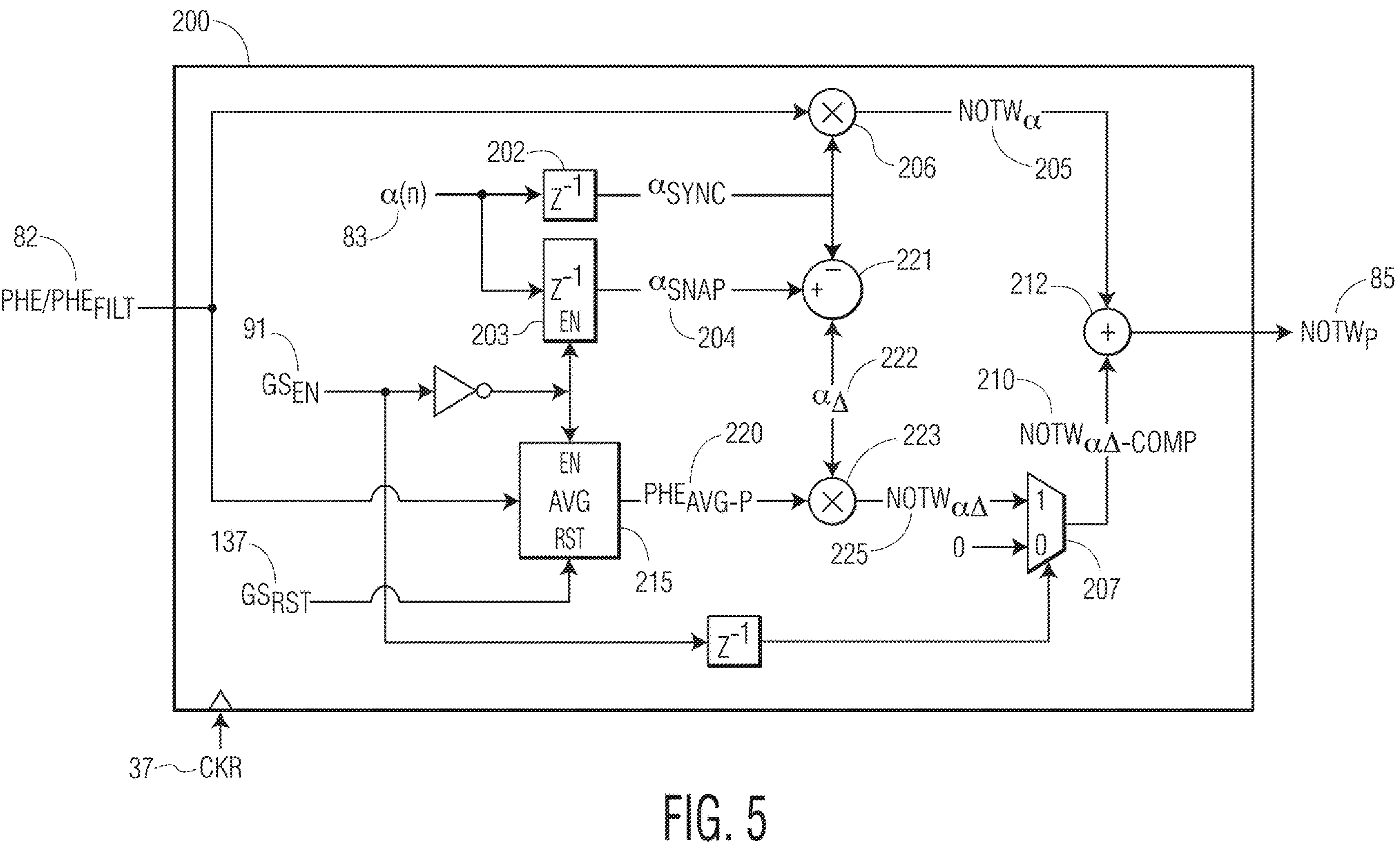
FIG. 5 is a block diagram of a proportional gear-shifting module, according to a representative embodiment of the present invention.

FIG. 5 is a block diagram of a proportional gear-shifting module 200, according to a representative embodiment of the present invention. That is, proportional gear-shifting module 200 is one example of proportional gear-shifting module 84 (discussed above), specifically, one that inputs PHE 82, but does not input or process $PHE_{COMP-P}$ 152 or any other phase-compensation signal. Prior to the assertion of $GS_{EN}$ 91, both of delay elements 202 and 203 are enabled and, therefore, output the proportional gain (α) 83 from the previous cycle of clock signal 37. In the preferred embodiments, $GS_{EN}$ 91 is asserted in the clock cycle immediately prior to the changing of the gain value, so prior to the assertion of $GS_{EN}$ 91, the current and previous values of the proportional gain (α) 83 are the same, so the tentative proportional control signal component ($NOTW_\alpha$) 205 output by multiplier 206 is PHE 82 times the current value of the proportional gain (α) 83. Also, because $GS_{EN}$ 91 is 0, the output of multiplexer 207, which is the proportional control-signal correction value ($NOTW_{\alpha\Delta-COMP}$) 210, is 0, meaning that the proportional component of the control signal ($NOTW_P$) 85 output from adder 212 is just equal to the tentative proportional control signal component ($NOTW_\alpha$) 205.

However, during this time, averaging module 215 is enabled, processing PHE 82 (preferably, current and past values thereof) to provide a characteristic proportional phase-error value. In the current embodiment, this characteristic proportional phase-error value is an average proportional phase-error value ($PHE_{AVG-P}$) 220 over a specified number of previous samples, e.g., 128 samples. It should be noted that whenever averaging is referenced herein, such a reference can be replaced with any other technique or process for determining a characteristic value, such as determining the characteristic value as, or based on: (1) a simple snapshot at a specified point in time; (2) a moving average of values completed at a specified point in time; (3) any other averaging of values; (4) any low-pass filtering (finite impulse response or infinite impulse response) of the values after a specified period of time; or (5) any combination of any of the foregoing processes and/or techniques. As indicated above, however, $PHE_{AVG-P}$ 220 is not used while $GS_{EN}$ 91 is not being asserted.

Once $GS_{EN}$ 91 is asserted, delay element 203 and averaging module 215 are disabled so that their values are held, meaning that the output 204 of delay element 203 is the current value of proportional gain (α) 83, the output of subtractor 221 is the difference ($\alpha_\Delta$) 222 between the current and the immediately previous values of the proportional gain (α) 83. That difference ($\alpha_\Delta$) 222 is multiplied by $PHE_{AVG\text{-}P}$ 220 (or any other characteristic phase-error value determined within module 215) in multiplier 223 to provide the differential-proportional-gain-based-correction value ($NOTW_{\alpha\Delta}$) 225, which is then provided as $NOTW_{\alpha\Delta\text{-}COMP}$ 210 through multiplexer 207. Finally, the output of adder 212 is provided as the proportional component $NOTW_P$ 85, i.e., the sum of tentative proportional control signal component ($NOTW_\alpha$) 205 and proportional control-signal correction value ($NOTW_{\alpha\Delta\text{-}COMP}$) 210.

Figure 6:
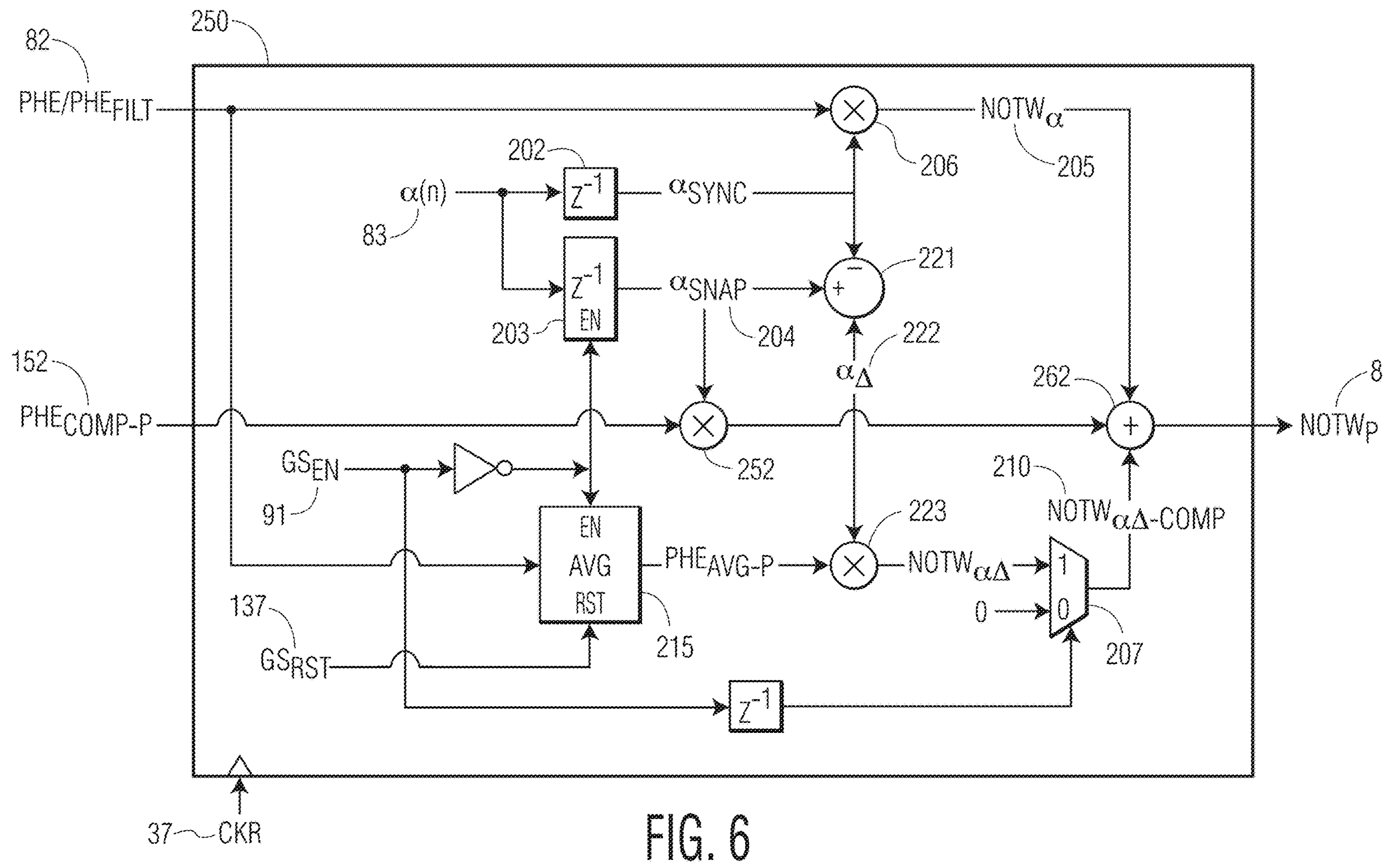
FIG. 6 is a block diagram of a proportional gear-shifting module that also processes input phase-error compensation, according to a representative embodiment of the present invention.

FIG. 6 is a block diagram of a proportional gear-shifting module 250, which is identical to proportional gear-shifting module 200 but supplemented to input and process $PHE_{COMP\text{-}P}$ 152. Specifically, $PHE_{COMP\text{-}P}$ 152 is multiplied by the output 204 of switchable delay element 203 (which, as noted above, depends upon $GS_{EN}$ 91) in multiplier 252. The output 254 of multiplier 252 is then provided as an additional input to adder 262 (having one more input than adder 212). As a result, the output of adder 262 is provided as the proportional component $NOTW_P$ 85, i.e., the sum of tentative proportional control signal component ($NOTW_\alpha$) 205, proportional control-signal correction value ($NOTW_{\alpha\Delta\text{-}COMP}$) 210, and the output of multiplier 252.

Figure 7:
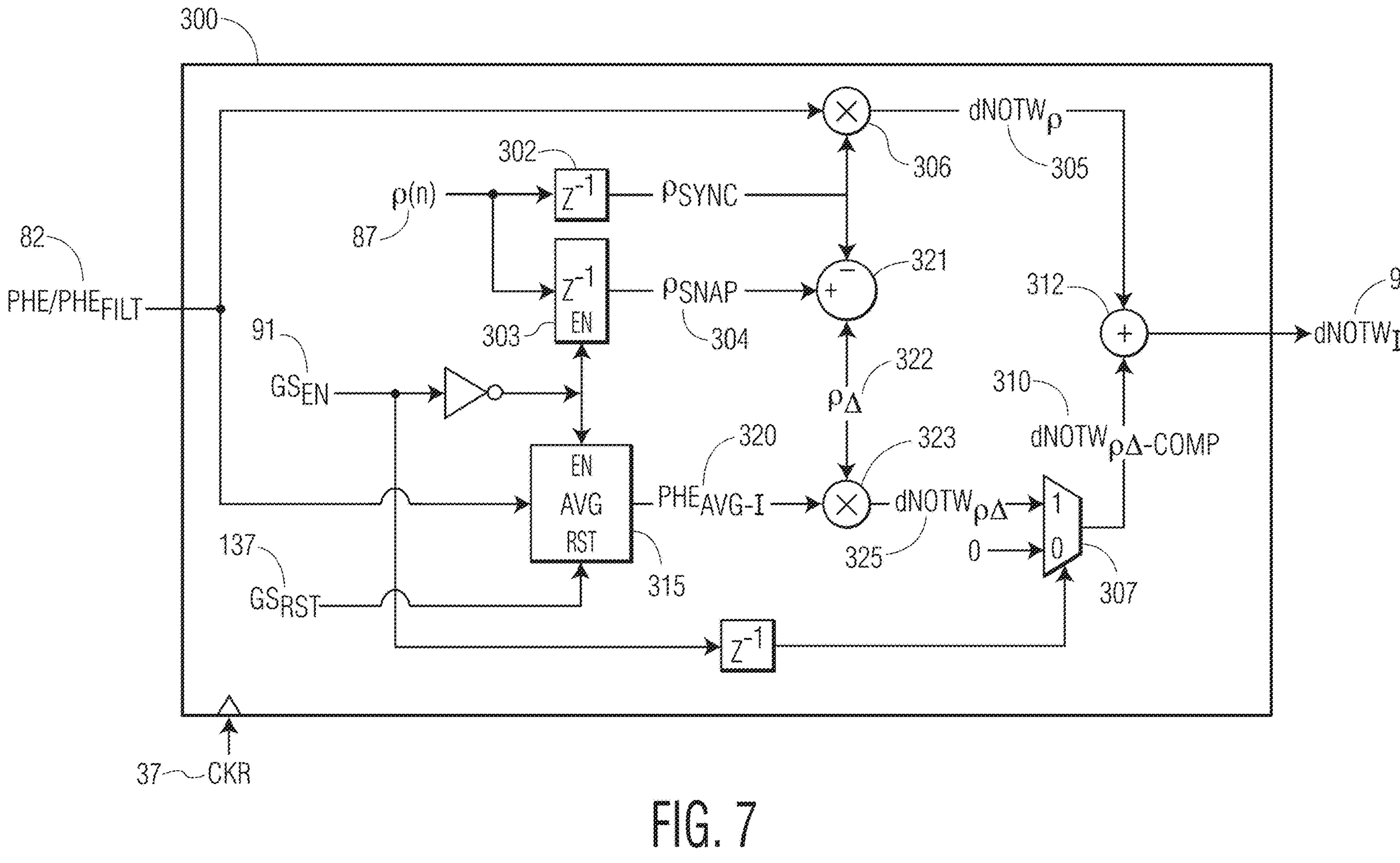
FIG. 7 is a block diagram of an integral gear-shifting module, according to a representative embodiment of the present invention.

FIG. 7 is a block diagram of an integral gear-shifting module 300, according to a representative embodiment of the present invention that can be used as integral gear-shifting module 88 (discussed above), specifically, one that inputs PHE 82, but does not input or process $PHE_{COMP\text{-}I}$ 153 or any other phase-compensation signal. Prior to the assertion of $GS_{EN}$ 91, both of delay elements 302 and 303 are enabled and, therefore, output the integral gain (ρ) 87 from the previous cycle of clock signal 37. As noted previously, $GS_{EN}$ 91 preferably is asserted in the clock cycle immediately prior to the changing of the gain value, so prior to the assertion of $GS_{EN}$ 91, the current and previous values of the integral gain (ρ) 87 are the same, so the tentative integral control signal component ($dNOTW_\rho$) 305 output by multiplier 306 is: PHE 82 times the current value of the integral gain (ρ) 87. Also, because $GS_{EN}$ 91 is 0, the output of multiplexer 307, which is the integral control-signal correction value ($dNOTW_{\rho\Delta\text{-}COMP}$) 310, is 0, meaning that the integral input signal $dNOTW_I$ 90 output from adder 312 is just equal to the tentative integral input signal ($dNOTW_\rho$) 305.

However, during this time, averaging module 315 (or one of the substitute modules discussed above in connection with averaging module 215) is enabled, processing PHE 82 (preferably, current and past values thereof) to provide a characteristic integral phase-error value. In the current embodiment, this characteristic integral phase-error value is an average integral phase-error value ($PHE_{AVG\text{-}I}$) 320 over a specified number of previous samples, e.g., 128 samples. As in the preceding embodiments, although averaging is used in the current embodiments, any other technique or process for determining a characteristic value instead can be used. As indicated above, however, $PHE_{AVG\text{-}I}$ 320 is not used while $GS_{EN}$ 91 is not being asserted.

Once $GS_{EN}$ 91 is asserted, delay element 303 and averaging module 315 are disabled so that their values are held, meaning that the output 304 of delay element 303 is the current value of integral gain (ρ) 87, the output of subtractor 321 is the difference ($\rho_\Delta$) 322 between the current and the immediately previous values of the integral gain (ρ) 87. That difference ($\rho_\Delta$) 322 is multiplied by $PHE_{AVG\text{-}I}$ 320 (or other characteristic phase-error value) in multiplier 323 to provide the differential-integral-gain-based-correction value ($dNOTW_{\rho\Delta}$) 325, which is then provided as $dNOTW_{\rho\Delta\text{-}COMP}$ 310 through multiplexer 307. Finally, the integral input signal $dNOTW_I$ 90 is output from adder 312 as the sum of tentative integral input signal ($dNOTW_\rho$) 305 and integral control-signal correction value ($dNOTW_{\rho\Delta\text{-}COMP}$) 310.

Figure 8:
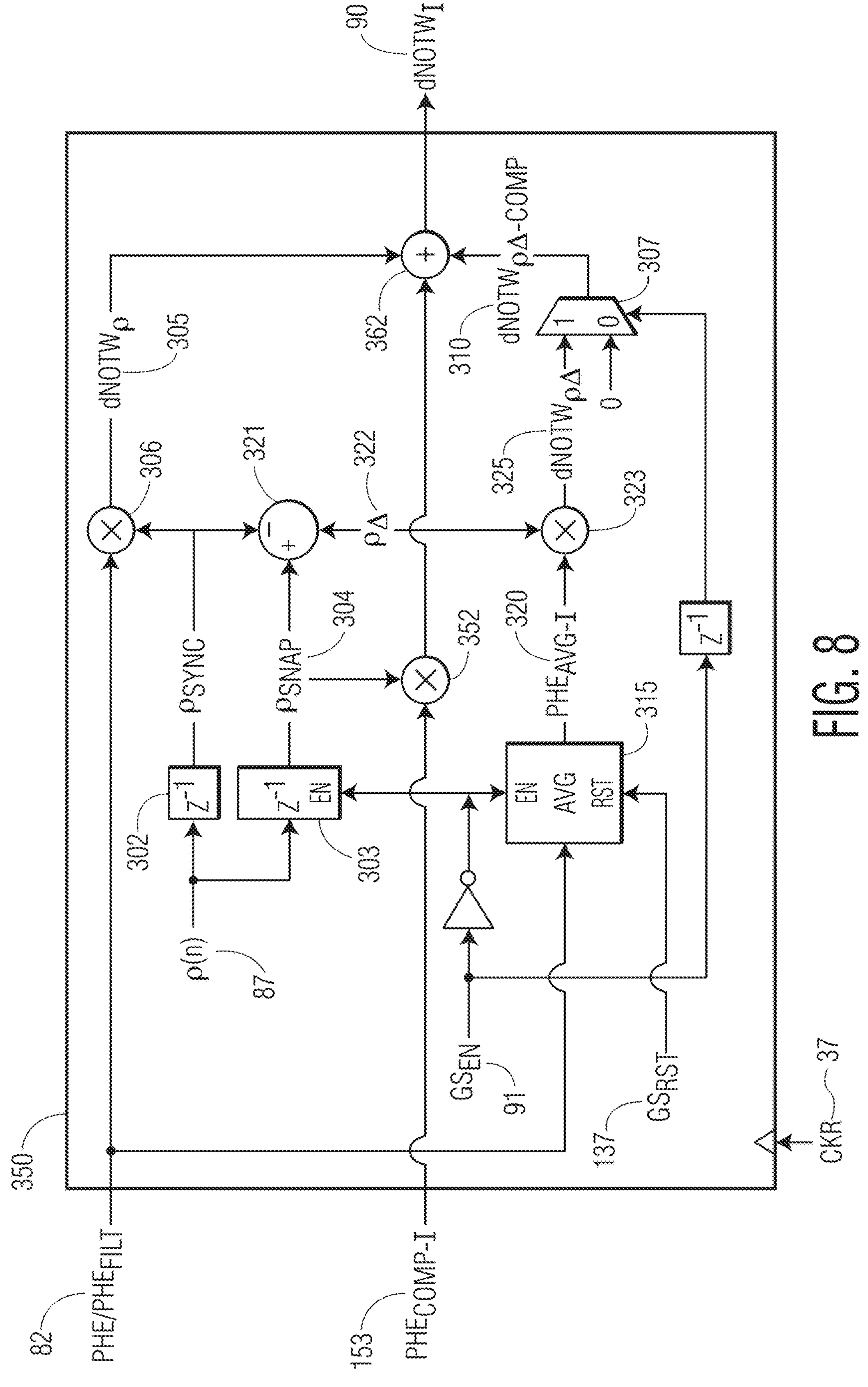
FIG. 8 is a block diagram of an integral gear-shifting module that also processes input phase-error compensation, according to a representative embodiment of the present invention.

FIG. 8 is a block diagram of an integral gear-shifting module 350, which is identical to integral gear-shifting module 300 but supplemented to input and process $PHE_{COMP\text{-}I}$ 153. Specifically, $PHE_{COMP\text{-}I}$ 153 is multiplied by the output 304 of switchable delay element 303 (which, as noted above, depends upon $GS_{EN}$ 91) in multiplier 352. The output 354 of multiplier 352 is then provided as an additional input to adder 362 (having one more input than adder 312). As a result, the integral input signal $dNOTW_I$ 90 is output from adder 362 as the sum of tentative integral input signal ($dNOTW_\rho$) 305, integral control-signal correction value ($dNOTW_{\rho\Delta\text{-}COMP}$) 310, and output 354 of multiplier 352.

Gear-Shifting Operation.

As noted above, $GS_{EN}$ 91 preferably is asserted just prior to the first change in either of the gain values 83 and/or 87. It preferably then continues to be asserted for as long as the PLL remains locked, thereby permitting arbitrary changes to such gain values 83 and/or 87 as and when desired.

Generally speaking, at beginning of a gear-shifting sequence, $GS_{EN}$ is asserted and $PHE_{AVG}$ is snapped in both the proportional and integral paths, as well as the current α & ρ coefficients, referred as $\alpha_1$ & $\rho_1$. For gear-shifting with compensation input (e.g., as discussed in connection with FIGS. 6 and 8 above), snapped $\alpha_1$ & $\rho_1$ coefficients are respectively applied to phase convergence compensation, $PHE_{COMP\text{-}P}$ and $PHE_{COMP\text{-}I}$ values to keep compensations valid and added respectively to the output $NOTW_P$ and $dNOTW_I$. PHE or $PHE_{FILT}$ inputs are multiplied respectively by $\alpha_n$ & $\rho_n$ coefficients in both the proportional and integral paths, giving $NOTW_\alpha$ and $dNOTW_\rho$ which are added respectively to the output $NOTW_P$ and $dNOTW_I$. Error terms, i.e., $(\alpha_1-\alpha_n)$. $PHE_{AVG\text{-}P}$ and $(\rho_1-\rho_n)$. $PHE_{AVG\text{-}I}$ respectively are applied in a feed-forward manner to the PIC proportional and integral paths and added respectively to the output $NOTW_P$ and $dNOTW_I$.

Assuming that PHE or $PHE_{FILT}$ has reached a steady-state condition before launching the averagers acquisition, the following can be written:

$$NOTW_P = \alpha_n \cdot PHE + (\alpha_1 - \alpha_n) \cdot PHE_{AVG-P} + \alpha_1 \cdot PHE_{COMP-P}$$

$$dNOTW_I = \rho_n \cdot PHE + (\rho_1 - \rho_n) \cdot PHE_{AVG-I} + \rho_1 \cdot PHE_{COMP-I}$$

$$PHE \approx PHE_{AVG-P} \approx PHE_{AVG-I}$$

which gives for the DC terms:

$$NOTW_P = \alpha_1 \cdot (PHE_{AVG-P} + PHE_{COMP-P}) \rightarrow \text{constant value}$$

$$dNOTW_I = \rho_1 \cdot (PHE_{AVG-I} + PHE_{COMP-I}) \rightarrow \text{constant value}$$

Another way to write the formulas is:

$$NOTW_P = NOTW_{P,SS} + \delta NOTW_P =$$
$$\alpha_n \cdot (PHE_{SS} + \delta PHE_{SS}) + (\alpha_1 - \alpha_n) \cdot PHE_{AVG-P} + \alpha_1 \cdot PHE_{COMP-P}$$
$$dNOTW_I = dNOTW_{I,SS} + \delta dNOTW_I =$$
$$\rho_n \cdot (PHE_{SS} + \delta PHE_{SS}) + (\rho_1 - \rho_n) \cdot PHE_{AVG-I} + \rho_1 \cdot PHE_{COMP-I}$$
$$PHE_{SS} \approx PHE_{AVG-P} \approx PHE_{AVG-I}$$

Then:

$$NOTW_{P,SS} = \alpha_1 \cdot (PHE_{AVG-P} + PHE_{COMP-P}) \rightarrow \text{constant value}$$
$$dNOTW_{I,SS} = \rho_1 \cdot (PHE_{AVG-I} + PHE_{COMP-I}) \rightarrow \text{constant value}$$
$$\delta NOTW_P = \alpha_n \cdot \delta PHE_{SS} \rightarrow \text{tracking/variable value}$$
$$\delta dNOTW_I = \rho_n \cdot \delta PHE_{SS} \rightarrow \text{tracking/variable value}$$

Steady State or DC terms remains constant while AC or small-signal terms are scaled accordingly by the $\alpha_n$ & $\rho_n$ coefficients, modulating the DPLL loop bandwidth without creating kicks in the loop during gear-shifting.

It should be readily apparent that the foregoing gear-shifting can be trigged as many time as desired. Any gear can be snapped, not necessarily just the first one, as is the case with conventional structures and approaches. Instead, gear-shifting can be done in both directions and even randomly as a result of the present invention. In other words, the present invention provides, among other things, a true on-demand DPLL bandwidth-modulation capability, with single-clock cycle latency to apply a selected new gear.

ADDITIONAL CONSIDERATIONS

As used herein, the term "optional" (and any other forms of that term) means that, depending upon the particular embodiment, the subject module, component or step may be omitted entirely or may be provided and then disabled (e.g., under the control of a separate processor, other type of module, or process step) when desired.

The foregoing discussion primarily focuses on DPLL implementations. Such implementations are preferred because of the greater flexibility afforded by digital processing. However, the present invention can also be implemented in any other kind of PLL.

As used herein, the term "coupled", or any other form of the word, is intended to mean either directly connected or connected through one or more other components, elements or processing blocks, e.g., for the purpose of preprocessing. In the drawings and/or the discussions of them, where individual steps, components, modules or processing blocks are shown and/or discussed as being directly connected to each other, such connections should be understood as couplings, which may include additional steps, components, modules, elements and/or processing blocks. Unless otherwise expressly and specifically stated otherwise herein to the contrary, references to a signal herein mean any processed or unprocessed version of the signal. That is, specific processing steps discussed and/or claimed herein are not intended to be exclusive; rather, intermediate processing may be performed between any two processing steps expressly discussed or claimed herein, except to the extent expressly stated otherwise.

Whenever a specific value is mentioned herein, such a reference is intended to include that specific value or substantially or approximately that value. In this regard, the foregoing use of the word "substantially" is intended to encompass values that are not substantially different from the stated value, i.e., permitting deviations that would not have substantial impact within the identified context. For example, stating that a continuously variable signal level is set to a particular value should be understood to include values within a range around such specifically stated value that produce substantially the same effect as the specifically stated value. For example, the identification of a single length, width, depth, thickness, etc. should be understood to include values within a range around such specifically stated value that produce substantially the same effect as the specifically stated value. As used herein, except to the extent expressly and specifically stated otherwise, the term "approximately" can mean, e.g.: within ±10% of the stated value or within ±20% of the stated value.

In the preceding discussion, the terms "operators", "operations", "functions" and similar terms refer to method or process steps or to hardware components, depending upon the particular implementation/embodiment.

In the event of any conflict or inconsistency between the disclosure explicitly set forth herein or in the accompanying drawings, on the one hand, and any materials incorporated by reference herein (whether explicitly or by operation of any applicable law, regulation or rule), on the other, the present disclosure shall take precedence. In the event of any conflict or inconsistency between the disclosures of any applications or patents incorporated by reference herein, the disclosure most recently added or changed shall take precedence.

Unless clearly indicated to the contrary, words such as "optimal", "optimize", "maximize", "minimize", "best", as well as similar words and other words and suffixes denoting comparison, in the above discussion are not used in their absolute sense. Instead, such terms ordinarily are intended to be understood in light of any other potential constraints, such as user-specified constraints and objectives, as well as cost and processing or manufacturing constraints.

In the above discussion, certain methods are explained by breaking them down into steps listed in a particular order. Similarly, certain processing is performed by showing and/or describing modules arranged in a certain order. However, it should be noted that in each such case, except to the extent clearly indicated to the contrary or mandated by practical considerations (such as where the results from one step are necessary to perform another), the indicated order is not critical but, instead, that the described steps and/or modules can be reordered and/or two or more of such steps (or the processing within two or more of such modules) can be performed concurrently.

References herein to a "criterion", "multiple criteria", "condition", "conditions" or similar words which are intended to trigger, limit, filter or otherwise affect processing steps, other actions, the subjects of processing steps or actions, or any other activity or data, are intended to mean "one or more", irrespective of whether the singular or the plural form has been used. For instance, any criterion or condition can include any combination (e.g., Boolean combination) of actions, events and/or occurrences (i.e., a multi-part criterion or condition).

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

As used herein, the words “include”, “includes”, “including”, and all other forms of the word should not be understood as limiting, but rather any specific items following such words should be understood as being merely exemplary.

Several different embodiments of the present invention are described above and/or in any documents incorporated by reference herein, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the intent and the scope of the invention. Accordingly, the invention is not limited to the precise embodiments shown in the drawings and described above. Rather, it is intended that all such variations not departing from the intent of the invention are to be considered as within the scope thereof, as limited solely by the claims appended hereto.

System Environment.

In general, it should be noted that, except as expressly noted otherwise, any process, method, functionality, module, block, unit or similar item referenced herein can be implemented by a general-purpose processor executing computer-executable process steps (e.g., software and/or firmware), by dedicated (e.g., logic-based) hardware, or any combination of these approaches, with the particular implementation being selected based on known engineering tradeoffs. That is, where any process and/or functionality described above is implemented in a fixed, predetermined and/or logical manner, it can be accomplished by a processor executing programming (e.g., software or firmware), an appropriate arrangement of logic components (hardware), or any combination of the two, as will be readily appreciated by those skilled in the art. In other words, it is well-understood how to convert logical and/or arithmetic operations into instructions for performing such operations within a processor and/or into logic gate configurations for performing such operations; in fact, compilers typically are available for both kinds of conversions.

It should be understood that the present invention also relates to machine-readable tangible (or non-transitory) media on which are stored software or firmware program instructions (i.e., computer-executable process instructions) for performing the methods and functionality and/or for implementing the modules and components of this invention. Such media include, by way of example, magnetic disks, magnetic tape, optically readable media such as CDs and DVDs, or semiconductor memory such as various types of memory cards, USB flash memory devices, solid-state drives, etc. In each case, the medium may take the form of a portable item such as a miniature disk drive or a small disk, diskette, cassette, cartridge, card, stick etc., or it may take the form of a relatively larger or less-mobile item such as a hard disk drive, ROM or RAM provided in a computer or other device. As used herein, unless clearly noted otherwise, references to computer-executable process steps stored on a computer-readable or machine-readable medium are intended to encompass situations in which such process steps are stored on a single medium, as well as situations in which such process steps are stored across multiple media.

What is claimed is:

1. A phase-lock loop gear shifter, comprising:
- an input for receiving a loop gain that is dynamically controllable;
- an input for receiving a phase-error signal;
- a subtractor configured to provide a gain difference between the loop gain input at a second time and the loop gain input at a first time, the first time being earlier than the second time;
- a module that determines a characteristic phase-error value based on the phase-error signal; and
- a multiplier that multiplies the gain difference by the characteristic phase-error value to provide a control-signal correction value.

2. The phase-lock loop gear shifter according to claim 1, further comprising a second multiplier that multiplies the phase-error signal by the loop gain at the first time to provide a tentative control signal component.

3. The phase-lock loop gear shifter according to claim 2, wherein the tentative control signal component is combined with the control-signal correction value to provide a component of the control signal.

4. The phase-lock loop gear shifter according to claim 3, wherein the component of the control signal is a proportional component.

5. The phase-lock loop gear shifter according to claim 3, wherein the component of the control signal is an integral input component.

6. The phase-lock loop gear shifter according to claim 1, further comprising an input for a clock signal,
- wherein on each cycle of the clock signal, the phase-error signal and the loop gain are input and the control signal is output,
- wherein the second time corresponds to the current clock cycle, and
- wherein the first time corresponds to the clock cycle immediately preceding the current clock cycle.

7. The phase-lock loop gear shifter according to claim 1, further comprising an input for a gear-shift enable signal which controls when gear-shifting is enabled, and
- wherein when gear-shifting is not enabled, the control-signal correction value is set at 0.

8. The phase-lock loop gear shifter according to claim 1, further comprising an input for a phase-compensation signal.

9. The phase-lock loop gear shifter according to claim 8, further comprising a second multiplier that multiplies the phase-compensation signal by the loop gain at the second time to provide a second control-signal correction value.

10. The phase-lock loop gear shifter according to claim 9, further comprising a third multiplier that multiplies the phase-error signal by the loop gain at the first time to provide a tentative control signal component.

11. The phase-lock loop gear shifter according to claim 10, wherein the control-signal correction value, the second control-signal correction value and the tentative control signal component are combined to provide a component of the control signal.

12. The phase-lock loop gear shifter according to claim 1, wherein the characteristic phase-error value is based on at least one of a moving average or a time-windowed accumulation of the phase-error signal.

13. The phase-lock loop gear shifter according to claim 1, wherein the characteristic phase-error value is determined by low-pass filtering the phase-error signal.

14. The phase-lock loop gear shifter according to claim 1, wherein the characteristic phase-error value is based on a value of the phase-error signal at a single point in time.

15. The phase-lock loop gear shifter according to claim 1, wherein the loop gain is a proportional-path gain.

16. The phase-lock loop gear shifter according to claim 1, wherein the loop gain is an integral-path gain.

17. A phase-lock loop, comprising:

an oscillator having an input for receiving a control signal and an output for providing an output signal having a frequency based on the control signal;

a phase detector having a first input for receiving a reference signal, a second input coupled to the output of the oscillator for receiving a feedback signal, and an output for providing a phase-error signal that is indicative of a phase difference between the reference signal and the feedback signal; and a loop filter having a first input coupled to the output of the phase detector and an output for providing the control signal to the oscillator, wherein the loop filter has a gear-shifting module that includes:

(a) an input for receiving a loop gain that is dynamically controllable, (b) a subtractor configured to provide a gain difference between the loop gain input at a second time and the loop gain input at a first time, the first time being earlier than the second time, (c) a module that determines a characteristic phase-error value based on the phase-error signal, and (d) a multiplier that multiplies the gain difference by the characteristic phase-error value to provide a control-signal correction value.

18. The phase-lock loop according to claim 17, wherein the gear-shifting module also includes a second multiplier that multiplies the phase-error signal by the loop gain at the first time to provide a tentative control signal component.

19. The phase-lock loop according to claim 18, wherein the tentative control signal component is combined with the control-signal correction value to provide a component of the control signal.

20. The phase-lock loop according to claim 19, wherein the component of the control signal is a proportional component, wherein the loop filter also has a second gear-shifting module, wherein the second gear-shifting module outputs an integral input component of the control signal, wherein the loop filter also includes an accumulator, wherein the accumulator inputs the integral input component and outputs a final integral component, and wherein the final integral component and the proportional component are combined to provide the control signal.

* * * * *